United States Patent [19]

Suster

[11] Patent Number: 4,493,639
[45] Date of Patent: Jan. 15, 1985

[54] CONDUCTIVE INK FOR FLASHLAMP ARRAY CIRCUIT

[75] Inventor: Mary E. Suster, Chagrin Falls, Ohio

[73] Assignee: General Electric Company, Schenectady, N.Y.

[21] Appl. No.: 570,415

[22] Filed: Jan. 13, 1984

Related U.S. Application Data

[63] Continuation of Ser. No. 489,870, May 6, 1983, , which is a continuation of Ser. No. 205,412, Nov. 10, 1980, abandoned.

[51] Int. Cl.³ .......................... F21K 5/00; H01B 1/06; G03B 15/02
[52] U.S. Cl. .................... 431/359; 252/510; 362/13
[58] Field of Search ............... 431/359; 252/510, 511; 362/13, 4, 15

[56] References Cited

U.S. PATENT DOCUMENTS

| | | | |
|---|---|---|---|
| 2,866,057 | 12/1958 | Peck | 252/511 |
| 4,118,334 | 10/1978 | Goebel | 252/510 |
| 4,290,748 | 9/1981 | Collins et al. | 431/359 |
| 4,344,108 | 8/1982 | Collins et al. | 431/359 |
| 4,410,307 | 10/1983 | Collins et al. | 431/359 |

Primary Examiner—Samuel Scott
Assistant Examiner—G. Anderson
Attorney, Agent, or Firm—John F. McDevitt; Philip L. Schlamp; Fred Jacob

[57] ABSTRACT

A modified carbon ink for a flash lamp array circuit containing a particulated electrically conductive material such as graphite or metal flakes, metal-coated glass spheres and the like. The increased electrical conductivity obtained in this manner improved flashability and electrostatic flash out protection for the associated flash lamps.

3 Claims, 2 Drawing Figures

CONDUCTIVE INK FOR FLASHLAMP ARRAY CIRCUIT

This application is a continuation of application Ser. No. 489,870, filed May 6, 1983, which is a continuation of application Ser. No. 205,412, filed Nov. 10, 1980 now abandoned.

CROSS REFERENCE TO RELATED APPLICATIONS

In U.S. patent application Ser. No. 92,696, filed Nov. 9, 1979, in the name of E. J. Collins and assigned to the present assignee, and now U.S. Pat. No. 4,290,748, there is described and claimed a photoflash lamp array circuit board including radiation-sensitive fuse elements provided by a circuit pattern utilizing an organic resin matrix having particulated electrically conductive material and a radiation-absorbing material dispersed therein. The fuse elements are formed by narrowing the width of the circuit pattern at fuse locations while further reducing the thickness of the underlying dielectric substrate of the circuit board member relative to the remaining thickness of said dielectric substrate.

Another U.S. patent application Ser. No. 191,917, filed Sept. 29, 1980, in the names of M. E. Suster and V. H. Weber, and now U.S. Pat. No. 4,344,109, also assigned to the present assignee, describes a flash lamp array having a printed circuit which is formed with a conductive ink utilizing carbon particles bonded to the circuit board with an organic polymer binder. Electrostatic flash out protection of the associated flash lamps is provided in said patent application with a particular grounding circuit to help offset the high electrical resistance characteristic of this type conductive ink.

Still another U.S. patent application Ser. No. 191,916, filed Sept. 29, 1980, in the names of E. J. Collins, M. E. Suster, and V. H. Weber, and now U.S. Pat. No. 4,344,108, and also assigned to the present assignee, discloses a flash lamp array having a printed circuit formed with the same type high resistance characteristic conductive ink but which employs wider circuit path means to help solve the problem of adequately protecting the associated lamps from accidental flashing due to electrostatic charges when the circuitry encounters various charged objects, such as persons and the like.

BACKGROUND OF THE INVENTION

The present invention is in the field of photoflash lamp arrays, such as the FlipFlash type of array. In all of the above referenced patent applications, there is generally disclosed a circuit board member having a plurality of high voltage flash lamps connected to a lamp firing circuit pattern deposited on the circuit board member and which further includes radiation-sensitive switches being connected in said circuit pattern for sequential firing of the flash lamps. Fuse elements are commonly included in the circuit pattern with the lower intensity flash lamps now being used for cost and energy saving considerations to help produce a more reliable means to interrupt the circuit path with the lesser amount of radiation being available from such type flash lamps. A more recent introduction of lower cost conductive inks utilizing carbon particles with an organic polymer binder to replace the conductive ink generally employing silver particulate has now created a need to modify the circuit pattern in various ways to insure that the associated flash lamps still remain adequately protected from accidental electrostatic flash out. It would be desirable, however, to provide said protection in the lower cost conductive ink itself so that modification of the circuit pattern to provide additional electrical grounding is less necessary.

SUMMARY OF THE INVENTION

The principal objects of the present invention are to provide an improved photoflash array utilizing a modified conductive ink of powdered carbon which exhibits greater electrical conductivity together with increased electrostatic flash out protection of the associated flash lamps. The present modified conductive ink is a mixture containing at least 25% in said mixture of the powdered carbon in the liquid ink with particulated electrically conductive material and an organic polymer binder. More particularly, the present improved photoflash array employs a plurality of high voltage type flash lamps connected to a lamp firing circuit pattern deposited on the circuit board member with radiation-sensitive switches being connected in said circuit pattern for sequential firing of said flash lamps, wherein the improvement comprises using said modified conductive ink for the circuit pattern. Since the presently modified conductive ink further demonstrates operational characteristics suitable for use as the fuse elements in this type circuit application, it is also possible to have said modified conductive ink serve both functions in the same embodiment. In said preferred embodiment, the width of the circuit pattern at the fuse locations is narrowed for reliable thermal decomposition thereat when actuated by heat and radiation emitted from an adjoining flash lamp when flashed. A still further preferred embodiment utilizing the present conductive ink to serve in said dual capacity locates both radiation switches and the fuse elements adjacent said flash lamps for simultaneous actuation of the circuit components when the adjoining flash lamp is flashed. Interruption of the circuit path is obtained in the activating flash lamp in this manner while the cooperating radiation switch provides an electrical path to the next unflashed lamp in the customary manner. Since the above referenced patent applications all further contain a detailed description of the manner in which the flash lamps are sequentially flashed in a predetermined order by such an arrangement of radiation actuated switched and fuse elements disposed in the circuit pattern, it is only further necessary in the present application to describe the nature of the improvements obtained in the modified circuit operation.

A suitable conductive ink providing improved operation as above generally indicated can be prepared by proper modification of available commercial carbon inks. One commercially available ink suitable for modification in accordance with the present invention is a product sold by the Advance Process Supply Company under the trade name designation "EL-796" which is reported to contain in percentages by weight 22.2% lamp black, 20% organic polymer binder mixture, with the remainder being various organic liquid vehicles. Customary removal of the liquid vehicles from said ink compositions as well as other commercial carbon inks produces a dry solid coating containing at least 25% by weight of the powdered carbon having a considerably higher electrical resistance (generally 30 or 40 times or more) than previously employed silver-containing conductive inks. Said higher resistance characteristic has not only been found heretofore to require additional circuit means for adequate protection of the associated flash lamps from accidental electrostatic flash out but has now been discovered to adversely influence flashing of flash lamps when the customary high voltage pulse is applied. With respect to the fuse operation, it has now been discovered that the fuse elements constructed from available carbon inks exhibit a considerable resistive characteristic interfering with reliable conductivity of the circuit path before said fuse elements are actuated. All of the foregoing problems with commercial carbon inks are substantially ameliorated in accordance with the present invention by incorporating up to approximately 50% by weight in the dry solid coating of a particulated electrically conductive material. The particulated electrically conductive material providing improved electrical conductivity in said circuit pattern can be selected from a particulated electrically conductive metal and/or a particulated electrically conductive metal containing material which can further contain up to approximately 15% by weight of said particulated electrically conductive material in flake form with an aspect ratio of diameter to thickness greater than 20. Graphite and metal flakes as well as metal coated glass spheres can thereby be added to the commercial carbon inks to produce improved electrostatic flash out protection and flashability of the associated flash lamps.

DESCRIPTION OF THE PREFERRED EMBODIMENTS

Figure 1:
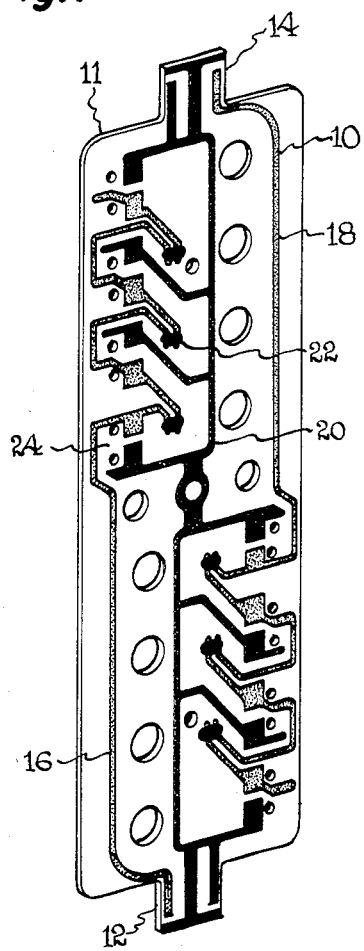
FIG. 1 is a perspective view of a flash array circuit board in accordance with a preferred embodiment of the invention.

In the preferred circuit board embodiment depicted in FIG. 1, there is depicted a circuit configuration wherein the lamp firing circuit pattern includes an electrical ground or "common" terminal connecting one lead-in wire of each associated flash lamp. The remaining lead-in wire of each flash lamp in this circuit pattern is electrically connected to a conductor line interconnecting a four-lamp group in the flash lamp array for application of the high voltage firing pulses to individual lamps in the group. Functionally, such interconnection of the individual lamps in each four-lamp group produces a parallel circuit connection of said flash lamps for sequential firing in a predetermined order when the high voltage firing pulses are applied. Accordingly, a lamp firing circuit pattern 10 is shown having been deposited on a circuit board member 11 preferably in the form of thermoplastic organic polymer material and with said circuit pattern being formed with the modified ink composition of the present invention. The circuit board member 11 also includes connector tabs 12 and 14 located at each end for insertion of said circuit board member into an associated camera socket (not shown). The camera socket has contacts for conductor lines 16, 18 and 20 of the lamp firing circuit pattern to connect four flash lamps in parallel between conductive line 16 and the common ground line 20 when connector tab 12 has been inserted in the camera socket. Correspondingly, the second group of four lamps is connected between conductor line 18 and said common ground line 20 when connector tab 14 has been inserted in the camera socket. While an entire illustrated circuit board is shown, there is need to discuss only a single group of four flash lamps since the operation of the second group of four flash lamps is essentially the mirror image of the first lamp group. Conductor line 16 includes a serially connected arrangement of radiation switches 22 to prevent the flash lamps of the group from all being fired together on release of the camera shutter. Functionally, each of said radiation switches is serially connected between the parallel connected lamp branch circuits and the switches employ a material exhibiting an open circuit or high resistance condition before actuation which converts to a low resistance by absorption of radiation and/or heat from an adjoining flash lamp when flashed. As can be noted, said radiation switches are each located adjacent to a flash lamp termination 24 so that the light and heat released when the lamp is flashed operates to convert the adjacent switch to an electrically conductive state thereby establishing a current path to the next lamp to be flashed. Assuming that none of the four lamps in the upper four-lamp group of said circuit pattern have been flashed, upon occurrence of the first firing pulse across the conductor lines 16 and 20, this pulse is applied to the lead-in wires of the first connected flash lamp and flashes this lamp to become an open circuit between its lead-in wires. Actuation of the radiation-sensitive switch located adjacent said lamp at this time provides a low resistance circuit path to the lead-in wires of the second lamp in the four-lamp sequence thereby connecting the second lamp to the circuit board terminals for flashing when the next firing pulse is applied. Successive flashing of the remaining lamps in the four-lamp group facilitated by closing of the cooperating radiation switches completes the desired sequential mode of operation.

To demonstrate the improved operational reliability attributable to the presently modified conductive ink, a comparative test evaluation was carried out using the same type firing circuit configuration above described. The test evaluation compared the incidence of lamp failure to flash in the four-lamp group using the above specified unmodified carbon ink as compared with said commercial conductive ink further containing approximately 15 weight percent graphite flakes based on the weight of the liquid ink coating. Of the 60 lamp groups tested with the unmodified commercial ink composition, 4.6% of the lamps did not flash when actuated with the customary high voltage firing pulses. Operating reliability increased with the modified composition when only 0.42% of the lamps did not fire in the proper sequence. Comparative dielectric breakdown voltage measurements carried out during said lamp flashability test further confirmed the nature of said improvement in that an average 1,523 volts dielectric breakdown voltage was measured for the flash lamp groups using the unmodified conductive ink in contrast to an average 1,036 volts dielectric breakdown voltage for the present conductive ink.

Figure 2:
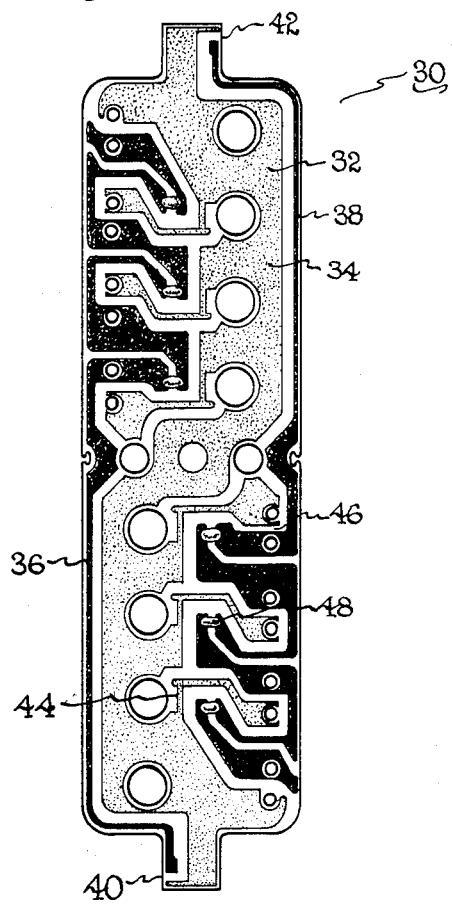
FIG. 2 is a perspective view of a different flash array circuit board in accordance with another preferred embodiment of this invention.

In FIG. 2 there is shown a circuit board member 30 having the same general configuration already described but further including fuse elements and employing a circuit board pattern 32 of the conductive carbon ink which is made wider in a particular manner to provide greater protection of the associated flash lamps from accidental electrostatic flash out. More particularly, a common electrical grounding circuit run 34 extends from one end of the circuit board member to the other end and is made wider than each of the conductive runs 36 and 38 which apply the firing pulses sequentially when the flash lamps are connected thereto. As can be further noted, the carbon ink material now occupies most of the connector tab areas 40 and 42 which decreases electrical resistance so that an electrostatic charge applied to these terminals will more readily be carried to further operatively associated electrical grounding means (not shown) instead of reaching the lamps to cause accidental flashing. This wider common circuit run 34 also permits a more condutive run in each firing circuit for improved flashability. Integral fuse elements 44 are provided in the circuit pattern, as distinct from the previously described circuit embodiment in FIG. 1, and with said fuse elements simply constituting a narrowing of the circuit pattern at the fuse locations for reliable thermal decomposition thereat when actuated by heat and radiation emitted from an adjoining flash lamp when flashed. Said individual fuse elements 44 are parallel connected in the common electrical grounding circuit run 34 as well as being located approximate to the flash lamp terminations 46 so as to also be activated by the heat and light released when the adjacent flash lamp is flashed. Further, location of radiation-sensitive switch elements 48 are adjacent to said flash lamps. Simultaneous activation of both switch and fuse elements when the adjoining flash lamp is flashed provides interruption of the circuit path to the activating flash lamp while the cooperating radiation switch furnishes an electrical path to the next unflashed lamp in the customary manner. Fuse operation entails absorption of radiation and/or heat by the circuit pattern at the fuse location whereupon the more narrow fuse element portion of said circuit pattern becomes sufficiently thermally decomposed to disrupt or impede the electrical connection to the already fired flash lamp. Comparative evaluation of the electrostatic flash out protection afforded in this circuit configuration with the conductive carbon ink above specifically disclosed as compared with the also above disclosed modification thereto containing approximately 26% graphite flakes based on the weight of the solid coating demonstrated considerable improvement attributable to said modification. Specifically, 5.6% of the lamps tested using the unmodified commercial ink were found to experience electrostatic flash out as compared with only 0.6% flash out for the improved ink.

While preferred embodiments of the invention have been shown and described, various other embodiments and modifications thereto will become apparent to persons skilled in the art. It is thereby intended to limit the present invention only by the scope of the following claims.

What I claim as new and desire to secure by Letters Patent of the United States is:

1. An improved photoflash array having a plurality of high voltage type flash lamps connected to a lamp firing circuit pattern deposited on a circuit board with radiation-sensitive switches being connected in said circuit pattern for sequential firing of said flash lamps, wherein the improvement comprises using a non-metallic conductive ink coating for said circuit pattern which is a mixture containing at least 25% by weight in the dry solid coating of powdered carbon with up to approximately 50% by weight in said dry solid coating of a particulated electrically conductive material selected from the group consisting of graphite flakes and conductive carbon, along with an organic polymer binder, said conductive ink exhibiting greater electrical conductivity together with increased electrostatic flash out protection of the flash lamp being provided by combination of said conductive ink with common electrical grounding circuit means having greater width than the width of the circuit pattern being employed to apply firing pulses to the associated flash lamps.

2. An improved photoflash array having a plurality of high voltage type flash lamps connected to a lamp firing circuit pattern deposited on a circuit board with radiation-sensitive switches and fuse elements being connected in said circuit pattern for sequential firing of said flash lamps, wherein the improvement comprises using a non-metallic conductive ink coating for said circuit pattern and fuse elements which is a mixture containing at least 25% by weight in the dry solid coating of powdered carbon with up to approximately 50% by weight in said dry solid coating of a particulated electrically conductive material selected from the group consisting of graphite flakes and conductive carbon, along with an organic polymer binder, said conductive ink exhibiting greater electrical conductivity together with increased electrostatic flash out protection of the flash lamp being provided by combination of said conductive ink with common electrical grounding circuit means having greater width than the width of the circuit pattern being employed to apply firing pulses to the associated flash lamps.

3. A photoflash array as in claim 2 wherein the radiation switches and fuse elements are located adjacent said flash lamps for simultaneous activation of an adjoining switch and fuse elements.

* * * * *